United States Patent

Yamagami

(10) Patent No.: US 9,467,068 B2
(45) Date of Patent: Oct. 11, 2016

(54) INVERTER DEVICE

(71) Applicant: KABUSHIKI KAISHA TOYOTA JIDOSHOKKI, Kariya-shi, Aichi-ken (JP)

(72) Inventor: Tomohiro Yamagami, Kariya (JP)

(73) Assignee: KABUSHIKI KAISHA TOYOTA JIDOSHOKKI, Aichi-ken (JP)

(*) Notice: Subject to any disclaimer, the term of this patent is extended or adjusted under 35 U.S.C. 154(b) by 3 days.

(21) Appl. No.: 14/442,020

(22) PCT Filed: Nov. 1, 2013

(86) PCT No.: PCT/JP2013/079682
§ 371 (c)(1),
(2) Date: May 11, 2015

(87) PCT Pub. No.: WO2014/080741
PCT Pub. Date: May 30, 2014

(65) Prior Publication Data
US 2015/0295514 A1 Oct. 15, 2015

(30) Foreign Application Priority Data

Nov. 26, 2012 (JP) .................................. 2012-257687
Jun. 5, 2013 (JP) .................................. 2013-119126

(51) Int. Cl.
*H02M 7/5387* (2007.01)
*B60L 11/18* (2006.01)
(Continued)

(52) U.S. Cl.
CPC ............ *H02M 7/53871* (2013.01); *B60L 3/00* (2013.01); *B60L 11/1861* (2013.01);
(Continued)

(58) Field of Classification Search
CPC ........... H02M 3/33507; H02M 3/315; H02M 3/335; H02M 1/32; H02M 7/53873; H02M 7/53871; H02M 7/521; H02M 7/5387; H02H 7/122

USPC ......... 363/55, 56.01, 56.02, 95, 97, 98, 131, 363/132
See application file for complete search history.

(56) References Cited

U.S. PATENT DOCUMENTS 6,075,346 A * 6/2000 Kikuchi ................. B60K 6/445
320/137
8,572,412 B1 * 10/2013 Solt ......................... G06F 1/206
702/132
(Continued)

FOREIGN PATENT DOCUMENTS

JP          10-089053 A     4/1998
JP          2008-283809 A   11/2008
(Continued)

OTHER PUBLICATIONS

International Search Report for PCT/JP2013/079682 dated Dec. 17, 2013 [PCT/ISA/210].
(Continued)

*Primary Examiner* — Adolf Berhane
(74) *Attorney, Agent, or Firm* — Sughrue Mion, PLLC

(57) ABSTRACT

An inverter device includes an inverter circuit, which has switching elements in a bridge connection, a capacitor, which is connected in parallel to the input side of the inverter circuit, a temperature detector, which detects the temperature of the capacitor, a battery charge information acquisition section, which acquires charge information related to a battery connected to the input side of the inverter circuit, and a warm-up controller. When the temperature of the capacitor detected by the temperature detector is lower than a prescribed temperature, the warm-up controller determines a warm-up current based on the battery charge information acquired by the battery charge information acquisition section and the temperature of the capacitor detected by the temperature detector, and controls the switching elements of the inverter circuit to supply the warm-up current to the coil of an electric motor connected to the output side of the inverter circuit.

8 Claims, 11 Drawing Sheets

(51) Int. Cl.
  *B60L 15/00* (2006.01)
  *H02M 1/32* (2007.01)
  *B60L 3/00* (2006.01)
  *G01R 31/36* (2006.01)
  *H02P 27/06* (2006.01)

(52) U.S. Cl.
  CPC ......... *B60L 11/1875* (2013.01); *B60L 15/007* (2013.01); *G01R 31/362* (2013.01); *G01R 31/3675* (2013.01); *H02M 1/32* (2013.01); *H02M 7/5387* (2013.01); *B60L 2210/30* (2013.01); *B60L 2210/42* (2013.01); *B60L 2240/525* (2013.01); *B60L 2240/526* (2013.01); *B60L 2240/529* (2013.01); *B60L 2240/545* (2013.01); *B60L 2240/547* (2013.01); *B60L 2240/549* (2013.01); *H02M 7/53873* (2013.01); *H02M 2001/327* (2013.01); *H02P 27/06* (2013.01); *Y02T 10/644* (2013.01); *Y02T 10/645* (2013.01); *Y02T 10/705* (2013.01); *Y02T 10/7005* (2013.01); *Y02T 10/7044* (2013.01); *Y02T 10/7241* (2013.01)

(56) References Cited

U.S. PATENT DOCUMENTS

| | | |
|---|---|---|
| 2009/0039813 A1 | 2/2009 | Yamada et al. |
| 2015/0295490 A1* | 10/2015 | Yamagami ............. H02M 1/32 363/49 |

FOREIGN PATENT DOCUMENTS

| | | | |
|---|---|---|---|
| JP | 2009-060776 A | 3/2009 | |
| JP | 2012-40915 A | 3/2012 | |
| JP | 2012-098866 A | 5/2012 | |
| JP | 2012-158303 A | 8/2012 | |
| JP | EP 2924875 A1 * | 9/2015 | .......... B60L 11/1861 |
| JP | EP 2924876 A1 * | 9/2015 | ............ B60L 15/007 |

OTHER PUBLICATIONS

International Preliminary Report on Patentability dated May 28, 2015, issued by the International Bureau of WIPO in counterpart International Application No. PCT/JP2013-079682.
Communication dated Oct. 27, 2015 from the Japanese Patent Office in counterpart application No. 2013-119126.

\* cited by examiner

INVERTER DEVICE

CROSS REFERENCE TO RELATED APPLICATIONS

This application is a National Stage of International Application No. PCT/JP2013/079682 filed Nov. 1, 2013, claiming priorities based on Japanese Patent Application Nos. 2012-257687 filed Nov. 26, 2012 and 2013-119126 filed Jun. 5, 2013, the contents of all of which are incorporated herein by reference in their entirety.

FIELD OF THE INVENTION

The present invention relates to an inverter device.

BACKGROUND OF THE INVENTION

Patent Document 1 discloses a battery control system that properly controls a voltage drop of a battery at starting of a device under a low-temperature environment. Specifically, the system gradually increases a current flowing from the battery to a load (various components forming the device) while monitoring the voltage drop when the temperature of the device at starting is lower than a specific temperature. Inverter devices that drive a motor include a capacitor as a component. The internal resistance of the capacitor increases under a low-temperature environment. Thus, if a great input is applied to such an inverter device from the motor during, for example, regenerating operation, an internal voltage is increased, and switching elements, which are components of the inverter device, may possibly be destroyed. To avoid such a situation, the temperature of the capacitor needs to be quickly increased to reduce the capacitor internal resistance. For this reason, warm-up control is performed in which, during a startup, an electric current is applied for a few seconds without the motor being rotated, and thus generated heat is used to increase the temperature of the capacitor.

PRIOR ART DOCUMENT

Patent Document

Patent Document 1: Japanese Laid-Open Patent Publication No. 2012-98866

SUMMARY OF THE INVENTION

To promptly increase the capacitor temperature, a great current may be supplied during the warm-up control. However, if a great current is supplied to the inverter device under a low-temperature environment as the warm-up control, the voltage drop amount is undesirably increased since the internal resistance of the capacitor is increased. If the voltage drop amount is great, the system becomes unstable, and the microcomputer of the inverter device may be reset. The internal resistance of a battery changes depending on the charge state. Furthermore, in a case in which the battery is used in a low charge state, the internal resistance of the battery is increased by an amount corresponding to the decrease in the charge state in addition to the internal resistance of a case in which the battery is used in a fully charged state. Conventionally, the warm-up control is performed with a current value that depends on the assumption that the battery charge state is the lowest. When such a control is performed, the current value of the warm-up control is limited even if the battery charge state has not lowered, and the warm-up control of the capacitor takes a long time.

Accordingly, it is an objective of the present invention to provide an inverter device that promptly completes warm-up of a capacitor at a low ambient temperature.

To achieve the foregoing objective and in accordance with one aspect of the present invention, an inverter device is provided that includes an inverter circuit having a plurality of switching elements in a bridge connection, a capacitor, which is connected in parallel to an input side of the inverter circuit, a temperature detector, which detects a temperature of the capacitor, a battery charge information acquisition section that acquires charge information of a battery configured to be connected to the input side of the inverter circuit, and a warm-up controller. When the temperature of the capacitor detected by the temperature detector is lower than a prescribed temperature, the warm-up controller determines a warm-up current based on the charge information of the battery acquired by the battery charge information acquisition section and the temperature of the capacitor detected by the temperature detector and controls the switching elements of the inverter circuit to supply the warm-up current to a coil of an electric motor configured to be connected to an output side of the inverter circuit.

DETAILED DESCRIPTION OF THE PREFERRED EMBODIMENTS

First Embodiment

An inverter device according to one embodiment of the present invention will now be described with reference to the drawings. The inverter device is mounted on a forklift and activates a driving electric motor and a cargo handling electric motor of the forklift. The forklift is a battery-operated forklift. The forklift is driven by a vehicle driving electric motor and performs cargo handling with a cargo handling electric motor. That is, when an operator operates an accelerator pedal in a state in which the key is turned on, the driving electric motor is activated to drive the forklift forward or rearward. When the operator manipulates the lift lever, the cargo handling electric motor is activated to lift or lower the fork to handle a cargo. Such a forklift may be used in a cold storage in which the ambient temperature is less than or equal to −40° C.

Figure 1:
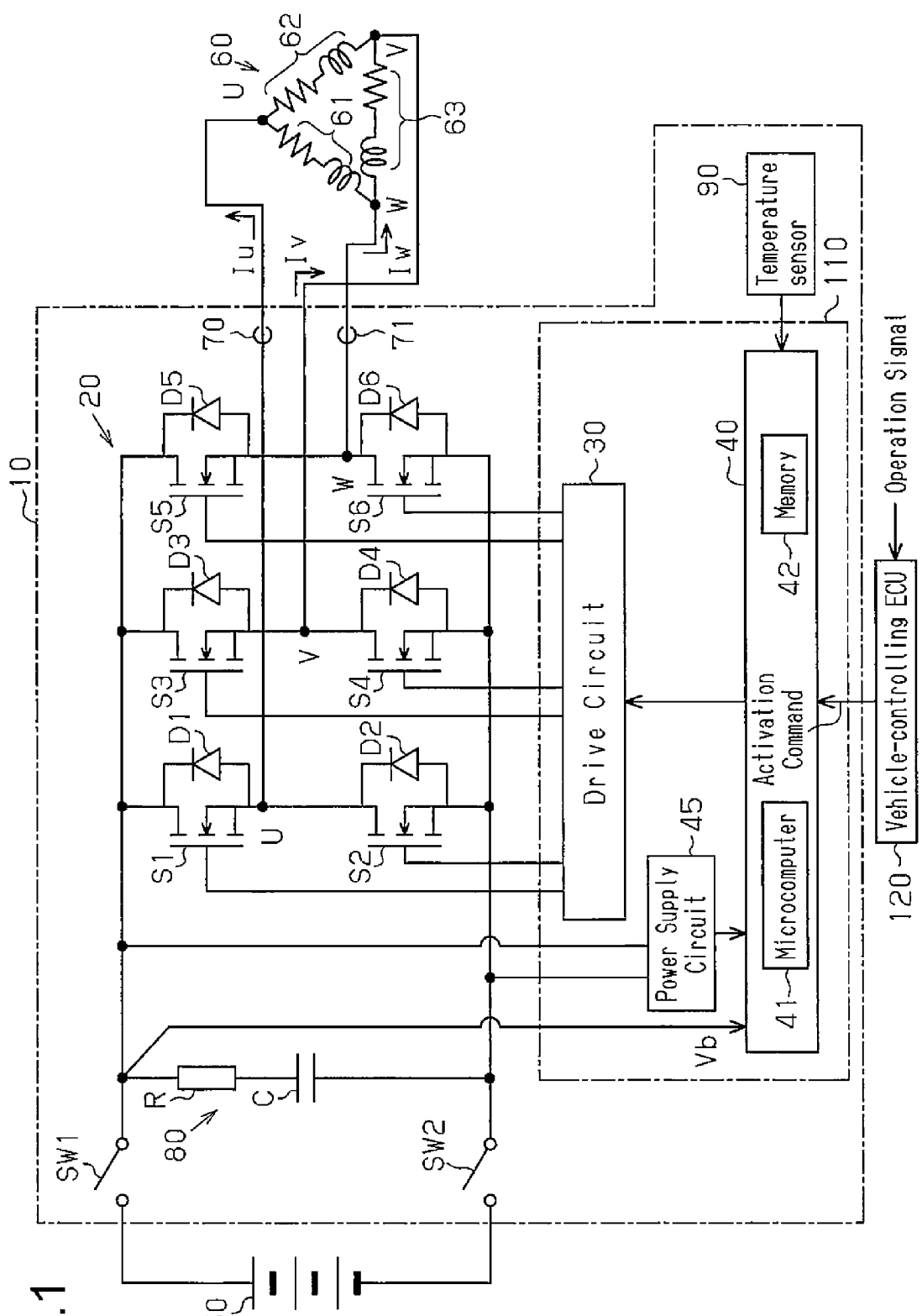
FIG. 1 is a circuit diagram of an inverter device according to one embodiment.

As shown in FIG. 1, an inverter device (three-phase inverter) 10 includes an inverter circuit 20, a drive circuit 30, and a controller 40. The input of the inverter circuit 20 is connected to a direct-current power source, which is a battery 50 in the present embodiment, via system relay switches SW1, SW2.

The output side of the inverter circuit 20 is connected to a vehicle driving electric motor (alternatively, a cargo handling electric motor) 60. A three-phase AC motor is used as the motor 60. The electric motor 60 includes coils 61, 62, 63 of different phases, which are connected to the output side of the inverter circuit 20.

The inverter circuit 20 has six switching elements S1 to S6. Each of the switching elements S1 to S6 is a power MOSFET. As switching elements, insulated-gate bipolar transistors (IGBT) may be used as switching elements. The switching elements S1 to S6 are connected in antiparallel to feedback diodes D1 to D6, respectively.

In the inverter circuit 20, the first and second switching elements S1 and S2 are connected in series, the third and fourth switching elements S3 and S4 are connected in series, and the fifth and sixth switching elements S5, S6 are connected in series. The first, third, and fifth switching elements S1, S3, S5 are connected to the positive terminal of the direct-current power source, which is the battery 50 in the present embodiment, via the system relay switch SW1. The second, fourth, and sixth switching elements S2, S4, S6 are connected to the negative terminal of the battery 50 via the system relay switch SW2.

The system relay switches SW1, SW2 are closed in response to an ON operation of the key switch and are opened in response to an OFF operation of the key switch. In FIG. 1, the operation signal includes operation signals of the key switch.

A connecting point between the switching elements S1 and S2, which form upper and lower arms for the U-phase, is connected to the U-phase terminal of the electric motor 60. A connecting point between the switching elements S3 and S4, which form upper and lower arms for the V-phase, is connected to the V-phase terminal of the electric motor 60. A connecting point between the switching elements S5 and S6, which form upper and lower arms for the W-phase, is connected to the W-phase terminal of the electric motor 60. The inverter device 10 supplies alternating currents to the coils 61 to 63 of respective phases of the electric motor 60, thereby driving the electric motor 60. As described above, the inverter circuit 20 has six switching elements S1 to S6 in a bridge connection.

The rated voltage of the battery 50 is, for example, 48 volts, and the withstand voltage of the switching elements S1 to S6 is approximately 75 volts. The battery (rechargeable battery) 50 may be, for example, a lead-acid battery, a lithium-ion battery, and a nickel-hydrogen battery.

Current sensors 70, 71 are provided between the inverter circuit 20 and the electric motor 60. The current sensors 70, 71 respectively detect the current values of currents Iu and Iw of the U-phase and W-phase, which are two phases of the three-phase currents Iu, Iv, Iw supplied to the electric motor 60.

An electrolytic capacitor 80 is connected to the input side of the inverter circuit 20 to be parallel with the battery 50.

The first, third, and fifth switching elements S1, S3, S5 are connected to the positive terminal of the electrolytic capacitor 80, and the second, fourth, and sixth switching elements S2, S4, S6 are connected to the negative terminal of the electrolytic capacitor 80. In general, if a capacitor is regarded as an equivalent circuit, the capacitor can be considered as including, in addition to an ideal capacitor component, a resistance component R and an inductor component L. In FIG. 1, the electrolytic capacitor 80 is equivalently represented by an ideal capacitor C and the resistance component R, which are connected in series. The resistance component R is an equivalent series resistance (ESR) of the capacitor.

As described above, the input side of the inverter circuit 20 is connected to the battery 50, which serves as a direct-current power source, and the electrolytic capacitor 80, which are connected in parallel.

The inverter device 10 includes a power supply circuit 45. The power supply circuit 45 is connected to the battery 50 via the system relay switches SW1, SW2. The power supply circuit 45 receives a voltage from the battery 50 and steps down the voltage to a predetermined voltage (for example, 15 volts) before supplying the voltage to the controller 40.

The controller 40 includes a microcomputer 41 and a memory 42. The microcomputer 41 operates upon receipt of the voltage (for example, 15 volts) from the power supply circuit 45.

The inverter device 10 includes a temperature sensor 90, which is mounted on a control board 110. The temperature sensor 90, which serves as a temperature detector, detects the temperature of the inverter device 10 (electrolytic capacitor 80). The temperature sensor 90 is connected to the controller 40, so that the microcomputer 41 of the controller 40 detects the temperature of the inverter device 10 (including the electrolytic capacitor 80). The microcomputer 41 of the controller 40 also detects a voltage Vb of the battery 50 (battery voltage). When controlling the electric motor 60 to perform normal operation under a low-temperature environment, the inverter device 10 functions to limit the currents output to the electric motor 60 to protect the electric motor 60 and components of the inverter device 10. For example, when the temperature of the inverter device 10 (including the electrolytic capacitor 80) drops, for example, to or below −20° C., the output currents to the electric motor 60 are limited.

The memory 42 stores various control programs necessary for driving the electric motor 60 and various data and maps for executing the control programs. The control program includes a normal control program for drivingly rotating the electric motor (motor) 60 and a control program for supplying a direct current to the electric motor 60 for warm-up control when the ambient temperature is low.

Figure 2:
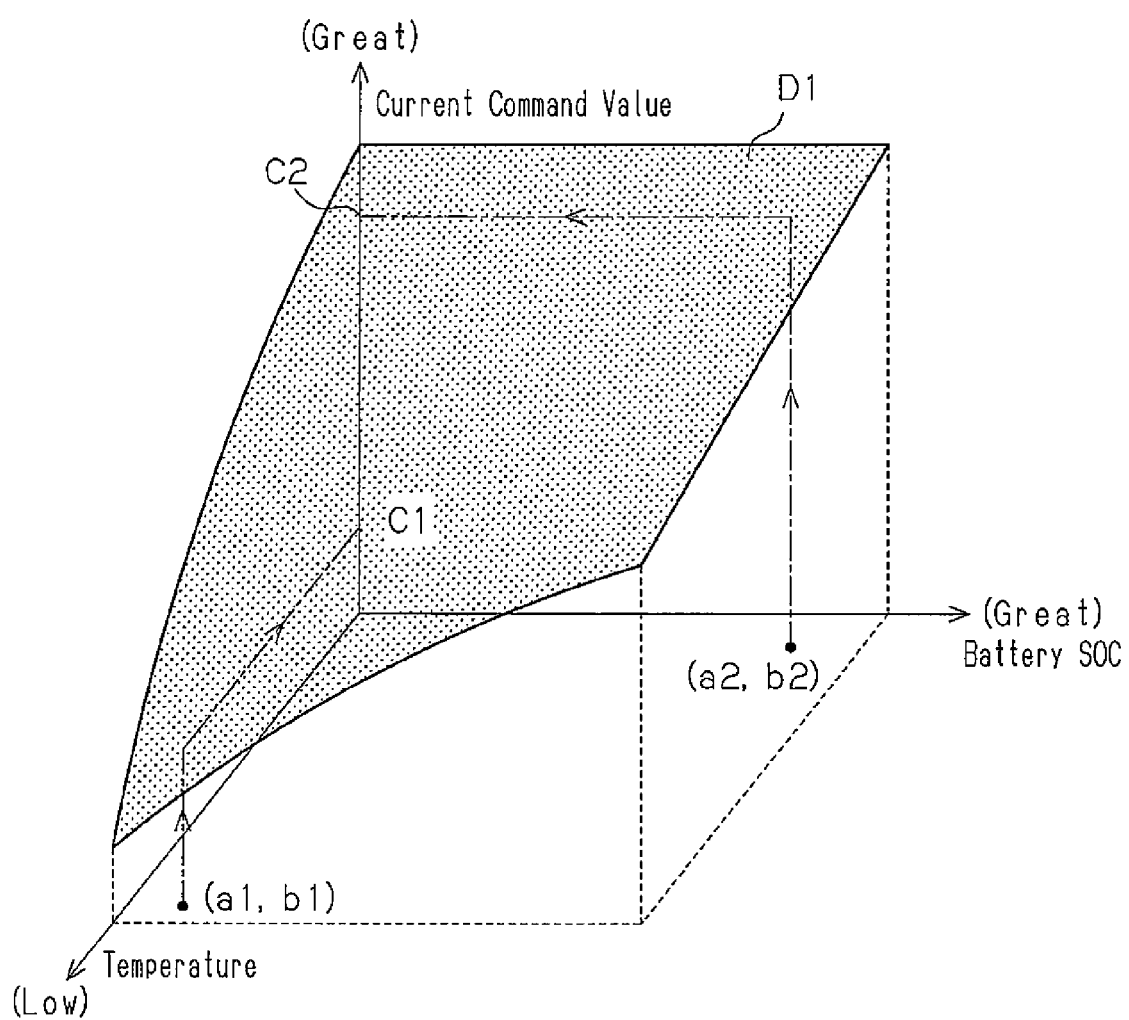
FIG. 2 is an explanatory diagram of a map stored in a memory.

The memory 42 also stores the current command map shown in FIG. 2. The coordinate system of FIG. 2 is an orthogonal three-axis coordinate system. The first axis represents the temperature of the electrolytic capacitor 80, the second axis represents the state of charge (SOC) of the battery, and the third axis represents a current command value supplied to the electric motor during warm-up control. That is, the memory 42, which serves as the storage, stores the map representing a relationship among the temperature of the electrolytic capacitor 80, the charge information of the battery 50, which is the battery SOC, and the current command value of a warm-up current (direct current) to be supplied to the electric motor 60. FIG. 2 is used to calculate the current command value of the warm-up current to be supplied during the warm-up control from the temperature of the electrolytic capacitor 80 and the battery SOC. The lower the temperature of the electrolytic capacitor 80 is, the smaller the current command value supplied during the warm-up control is set to, and the lower the battery SOC is, the smaller the current command value supplied during the warm-up control is set to. The battery state of charge is a value representing the rate of remaining charge with respect to the battery charging capacity.

More specifically, for example, if the temperature is at a low temperature a1 and the battery SOC has a small value b1, the electric current (current command value) supplied during the warm-up control has a small value C1. In contrast, if the temperature is at a high temperature a2 and the battery SOC has a great value b2, the electric current (current command value) supplied during the warm-up control has a great value C2.

In FIG. 1, the controller 40 is connected to the gates of the switching elements S1 to S6 via the drive circuit 30. The current sensors 70, 71 are connected to the controller 40. Based on detection signals from the sensors 70, 71, the microcomputer 41 of the controller 40 outputs control signals to the switching elements S1 to S6 via the drive circuit 30 such that the electric motor 60 generates power to a target level. The inverter circuit 20 converts the direct current from the battery 50 and the electrolytic capacitor 80 into alternating currents of three phases having an appropriate frequency and outputs the alternating currents to the electric motor 60.

The vehicle has a vehicle-controlling electronic control unit (ECU) 120. The vehicle-controlling ECU 120 includes a microcomputer and a power supply circuit. The microcomputer operates upon receipt of electric power from the battery 50 via the power supply circuit. The vehicle-controlling ECU 120 receives operation signals from operation sensors (not shown) manipulated by the operator and controls the movement of the vehicle, accordingly.

The controller 40 is connected to the vehicle-controlling ECU 120, and the microcomputer 41 detects manipulation of the key switch. The controller 40, the drive circuit 30, and the power supply circuit 45 of the inverter device 10 are mounted on a control board 110.

Next, the operation will be described.

In general, when a great electric current is supplied from the inverter device under a low-temperature environment as the warm-up control, the degree of a voltage drop is increased as compared to a case at ordinary temperatures since the internal resistance of the capacitor is increased. When the dropped voltage value falls below the minimum operation voltage value for the control board of the inverter device, the microcomputer of the control board is reset. For this reason, the current value supplied to the coil during the warm-up control is limited in accordance with the ambient temperature, and electric currents are supplied until the capacitor temperature is raised to a predetermined temperature. However, it takes a long time for the capacitor temperature to be raised to the predetermined temperature. From the perspective of users, the warm-up control is preferably promptly completed for full-power operation in as early a stage as possible. Looking now at the entire system, the increase in the internal resistance due to temperature decrease occurs not only in the capacitor of the inverter device, but also in the battery (rechargeable battery) of the vehicle. In particular, the increase in the internal resistance is significant when the battery state of charge (SOC) is low. The resetting of the microcomputer due to a voltage drop may occur not only in the microcomputer of the inverter device, but also in any of the ECUs mounted on the vehicle.

In regard to only the battery, an excessive voltage drop during the warm-up control puts a burden on the battery and may possibly degrade the battery faster than usual.

The present embodiment obtains the ambient temperature while factoring in the charge information (SOC) of the battery 50 to quickly complete the warm-up control of the inverter device 10 while avoiding resetting of the ECUs (microcomputer 41) of the entire system and deterioration of the battery faster than usual (since the battery is a chemical cell, avoiding decrease in the voltage more than expected and progress in the deterioration). More specifically, the warm-up control is performed as follows.

Figure 3:
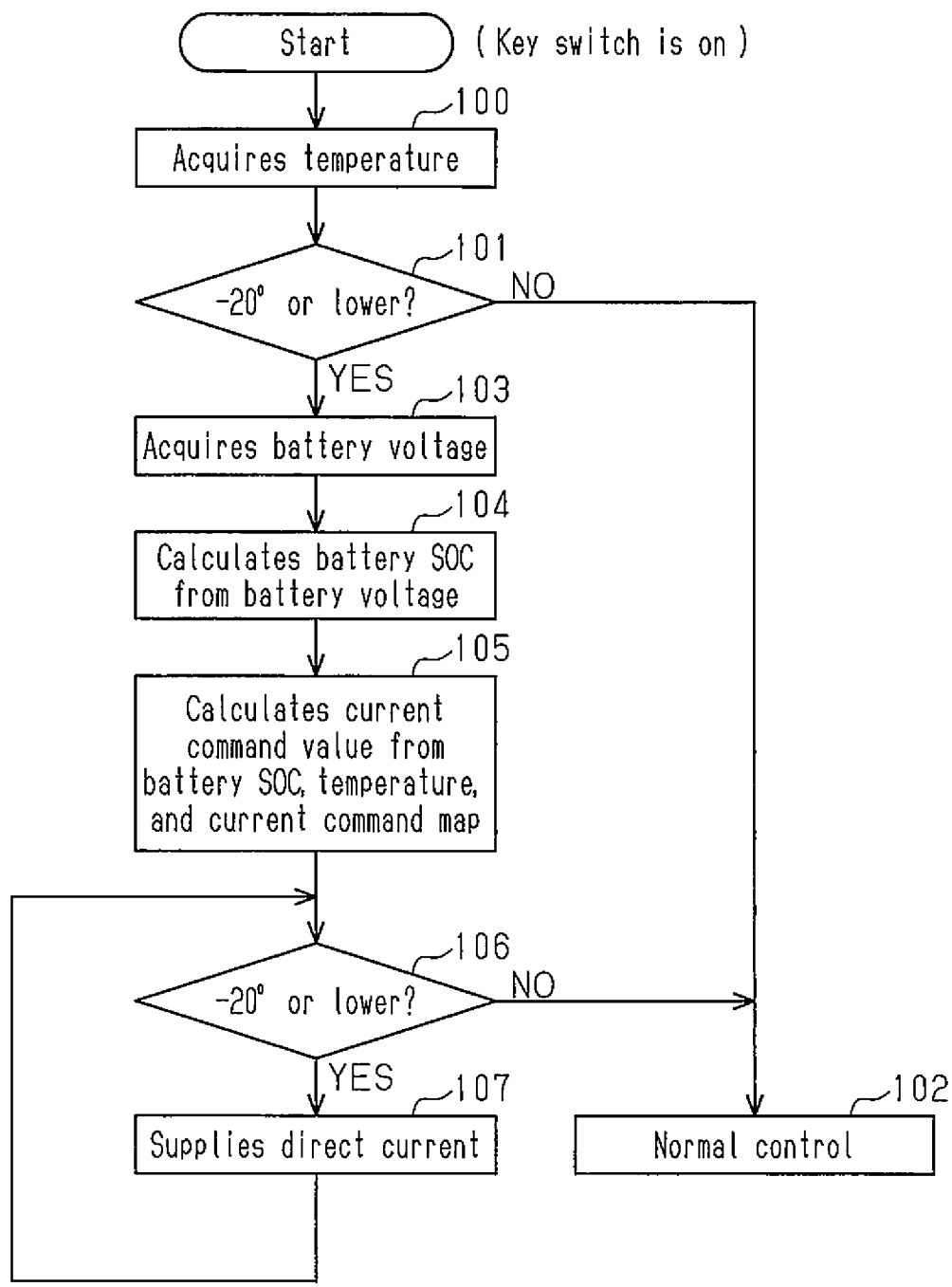
FIG. 3 is a flowchart for describing the operation according to a first embodiment.

As shown in FIG. 3, when the key switch is turned on to start the inverter device 10, the microcomputer 41 proceeds to step 100 to acquire the temperature of the inverter device 10 (including the electrolytic capacitor 80) detected by the temperature sensor 90 and then proceeds to step 101 to determine whether the temperature is lower than or equal to −20° C. (prescribed temperature). If the temperature of the inverter device 10 is higher than −20° C., the microcomputer 41 proceeds to step 102 and performs normal operation control.

In step 101, if the temperature of the inverter device 10 is lower than or equal to −20° C., the microcomputer 41 sets a warm-up mode. In the warm-up mode, the microcomputer 41, which serves as a battery charge information acquisition section, proceeds to step 103 to receive the initial voltage of the battery (system) and then proceeds to step 104 to calculate the battery SOC from the initial voltage of the battery and acquire the battery SOC, which is the battery charge information. In step 105, the microcomputer 41 calculates the current command value from the battery SOC, the temperature of the electrolytic capacitor 80 detected by the temperature sensor 90, and the current command map of FIG. 2. That is, the microcomputer 41 determines the current command value of the warm-up current in accordance with the battery SOC and the capacitor temperature detected by the temperature sensor 90 using the map stored in the memory 42.

In step 106, if the temperature is lower than or equal to −20° C., the microcomputer 41 proceeds to step 107. In step 107, the microcomputer 41 controls the switching elements S1 to S6 of the inverter circuit 20 to supply the current command value of the warm-up current to the electrolytic capacitor 80 via the coils 61 to 63 of respective phases of the electric motor 60. That is, the warm-up control is performed in which direct currents are supplied.

In step 106, if the temperature of the electrolytic capacitor 80 exceeds −20° C., the microcomputer 41 proceeds to step 102 and performs the normal operation control.

As described above, if the temperature of the electrolytic capacitor 80 is extremely low (for example, approximately −40° C.), the inverter device 10 supplies direct currents to the electric motor 60 to increase the temperature of the electrolytic capacitor 80. More specifically, when the temperature of the electrolytic capacitor 80 is lower than the prescribed temperature, the microcomputer 41 controls the switching elements S1 to S6 of the inverter circuit 20 to supply the warm-up current set based on the obtained battery SOC to the coils 61 to 63 of the electric motor 60 as the direct current. When the temperature of the electrolytic capacitor 80 reaches the prescribed value (for example, −20° C.), the normal operation control is performed. That is, the inverter device 10 activates the electric motor 60 by supplying alternating currents to the coils 61 to 63 of respective phases of the electric motor 60.

In this manner, even if the state of charge (SOC) of the battery 50 is low, the warm-up control of the inverter device 10 is performed in the shortest time without causing the microcomputer 41 to, for example, reset due to a voltage drop. That is, the warm-up control of the inverter device 10 is quickly completed by obtaining the battery SOC and the ambient temperature information while avoiding resetting of the ECUs (microcomputer 41) of the entire system and deterioration of the battery 50 faster than usual.

The above described embodiment has the following advantages.

(1) The inverter device 10 includes the temperature sensor 90 and the microcomputer 41, which serves as the battery charge information acquisition section and the warm-up controller. If the temperature of the electrolytic capacitor 80 detected by the temperature sensor 90 is lower than the prescribed temperature, the microcomputer 41 performs the warm-up control, in which the switching elements S1 to S6 of the inverter circuit 20 are controlled to supply the warm-up current, which is determined based on the acquired battery charge information and the temperature of the electrolytic capacitor 80 detected by the temperature sensor 90, to the coils 61 to 63 of the electric motor 60. Thus, the warm-up current determined based on the charge information of the battery 50 and the temperature of the electrolytic capacitor 80 is supplied to the coils 61 to 63 of the electric motor 60 to promptly complete warm-up of the electrolytic capacitor 80 at low temperatures.

(2) The present embodiment further includes the memory 42, which serves as the storage for storing the map representing the relationship among the temperature of the electrolytic capacitor 80, the charge information of the battery 50, and the current command value of the warm-up current. The microcomputer 41 determines the current command value of the warm-up current based on the acquired charge information of the battery 50 and the temperature of the electrolytic capacitor 80 detected by the temperature sensor 90 using the stored map. Thus, the present embodiment is more practical.

(3) The lower the temperature of the electrolytic capacitor 80 is and the lower the state of charge (SOC) of the battery 50 is, the smaller the current command value is set to by the microcomputer 41. Thus, warm-up of the electrolytic capacitor 80 is promptly completed at low temperatures.

(4) Since the microcomputer 41, which serves as the warm-up controller, controls the switching elements S1 to S6 of the inverter circuit 20 to supply the warm-up current to the coils 61 to 63 of the electric motor 60 as the direct current in the warm-up control, the present embodiment is practical.

Second Embodiment

A second embodiment will now be described. The differences from the first embodiment will be mainly discussed.

In general, the internal resistance of the capacitor and the battery is increased at low temperatures. Thus, during the warm-up control, the current command value for performing the warm-up control is determined such that the dropped voltage does not fall below a certain value factoring in the battery state of charge and the system temperature.

In the first embodiment, since the current command map shown in FIG. 2 is prepared in advance, the battery (rechargeable battery) is assumed to be the one that has the greatest internal resistance and the degree of deterioration among the various types. Thus, if the internal resistance of the battery (rechargeable battery) is small, the current value is reduced although the battery has a current supplying capability. From the perspective of users, the warm-up control is preferably promptly completed for full-power operation in as early a stage as possible. The battery to be mounted is up to the user, and the user may freely select a battery to be mounted. Thus, the battery cannot be limited to a specific one.

In the present embodiment, the controller 40 has a learning function for the optimal current command value so that the present embodiment is versatile and independent of the specific battery 50.

More specifically, the operation is as follows.

Figure 5:
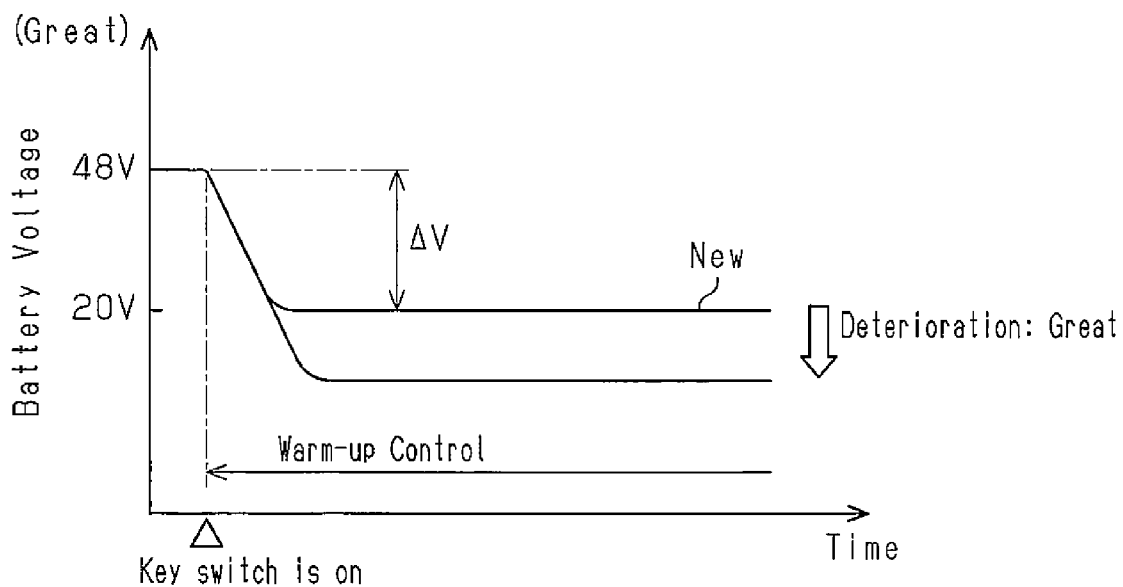
FIG. 5 is an explanatory diagram of a battery voltage during warm-up control.
Figure 6:
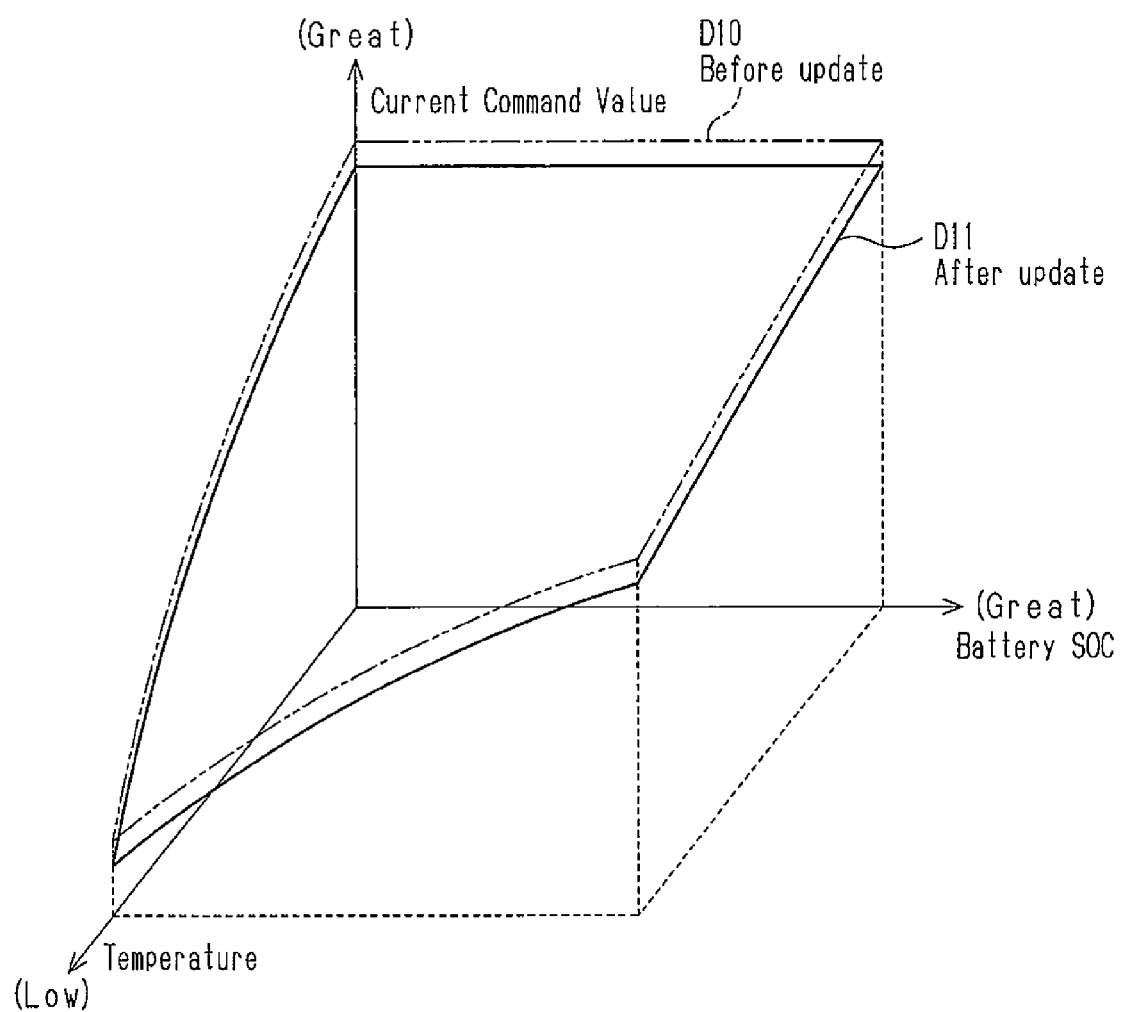
FIG. 6 is an explanatory diagram of a map after learning (after updating)

The microcomputer 41 obtains the system voltage (battery voltage) at starting of the inverter device 10. The microcomputer 41 then estimates the battery SOC from the system voltage. The microcomputer 41 also obtains the temperature information at the same time. The microcomputer 41 determines the current command value based on the battery SOC, the temperature, and the current command map. Subsequently, the microcomputer 41 performs the warm-up control. While performing the warm-up control, in step 200 of FIG. 4, the microcomputer 41 acquires the battery voltage during the warm-up control. In step 201, the microcomputer 41 calculates a current command map correction amount based on the estimated value of the battery SOC, the temperature, the battery voltage during the warm-up control, and the current command value. In step 202, the microcomputer 41 updates the current command map and stores the updated current command map in the memory 42. As shown in FIG. 5, since the battery voltage during the warm-up control decreases as the deterioration progresses, the current command map is updated as shown in FIG. 6 based on the measurement result of the battery voltage during the warm-up control. In FIG. 6, D10 represents the map before an update, and D11 represents the updated map.

More specifically, the lower limit of the decrease in the battery voltage is determined. For example, if the battery voltage is decreased from 48 V to 30 V when the electric current exceeds 100 A, since the voltage at which the system fails is over 10 V, a little more electric current can be supplied. That is, the drop amount of the battery voltage can be increased. In this case, the current command map is shifted upward in FIG. 2 as an updating process. In addition, if deterioration of the battery progresses and the voltage becomes less than or equal to 20 V although an electric current of 120 A is supplied assuming that the battery voltage will be 20 V, the current command map is shifted downward in FIG. 6 as the updating process to supply an electric current of 110 A.

The learning function provides versatility and allows the warm-up control to be promptly completed using the optimal current command value without preparing multiple current command maps. Since it is unnecessary to store the multiple current command maps, the hardware such as a memory can be saved. Furthermore, when the battery 50 is assumed to be a lead cell, management of, for example, water retention is left to the user, and the user is allowed to handle the parts greatly related to the internal resistance value.

In addition to the advantages (1) to (4), the present embodiment provides the following advantage.

(5) The microcomputer 41 has a learning function for updating the current command value. That is, the microcomputer 41, which serves as a learning section, updates the map representing the relationship among the temperature of the electrolytic capacitor 80, the charge information of the battery 50 (SOC), and the current command value of the warm-up current based on the voltage of the battery 50 during the warm-up control and stores the updated map in the memory 42. Thus, the map is updated in accordance with the degree of deterioration of the battery 50 and the battery property, and the updated map is stored in the memory 42.

Figure 4:
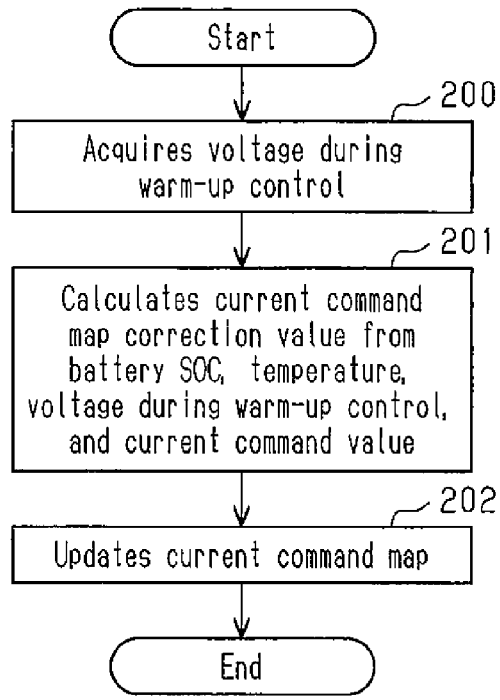
FIG. 4 is a flowchart for describing the operation according to a second embodiment.

In step 200 of FIG. 4, instead of acquiring the battery voltage during the warm-up control, the drop amount of the battery voltage may be acquired. More specifically, the drop amount of the battery voltage refers to the difference ΔV between the voltage when a system switch is turned on and the voltage during the warm-up control in FIG. 5. The drop amount of the battery voltage depends on the degree of deterioration of the battery and the battery property (battery type).

Third Embodiment

A third embodiment will now be described. The differences from the second embodiment will be mainly discussed.

The second embodiment includes the learning function in which the current command value corresponding to the temperature and the battery SOC in the current command map is updated based on the battery voltage during the warm-up control. The current command value when performing the warm-up control is determined based on the previously learned result. At this time, if the warm-up control is not frequently performed, that is, if the time period from when the previous warm-up control is performed to when the present warm-up control is performed is long, deterioration of the battery may have progressed. In this case, depending on the current command value, the voltage drop amount may be greater than expected and may undesirably fall below the minimum voltage required for system operation.

The present embodiment determines the optimal warm-up control current command value and quickly completes the warm-up control even in the case in which the time period from when the previous warm-up control is performed to when the present warm-up control is performed is long or in a case in which the battery of the system has been replaced.

For this purpose, voltage amplitude is caused by fluctuating electric currents within a certain range, the central value of which is the current command value, during the warm-up control. The voltage amplitude corresponds to the battery state of charge. Thus, when the voltage amplitude is great, the current command value is reduced in order to control the current command value of the warm-up control in accordance with the voltage amplitude. Furthermore, when the voltage amplitude is small, the current command value is increased.

More specifically, the operation is as follows.

Figure 7:
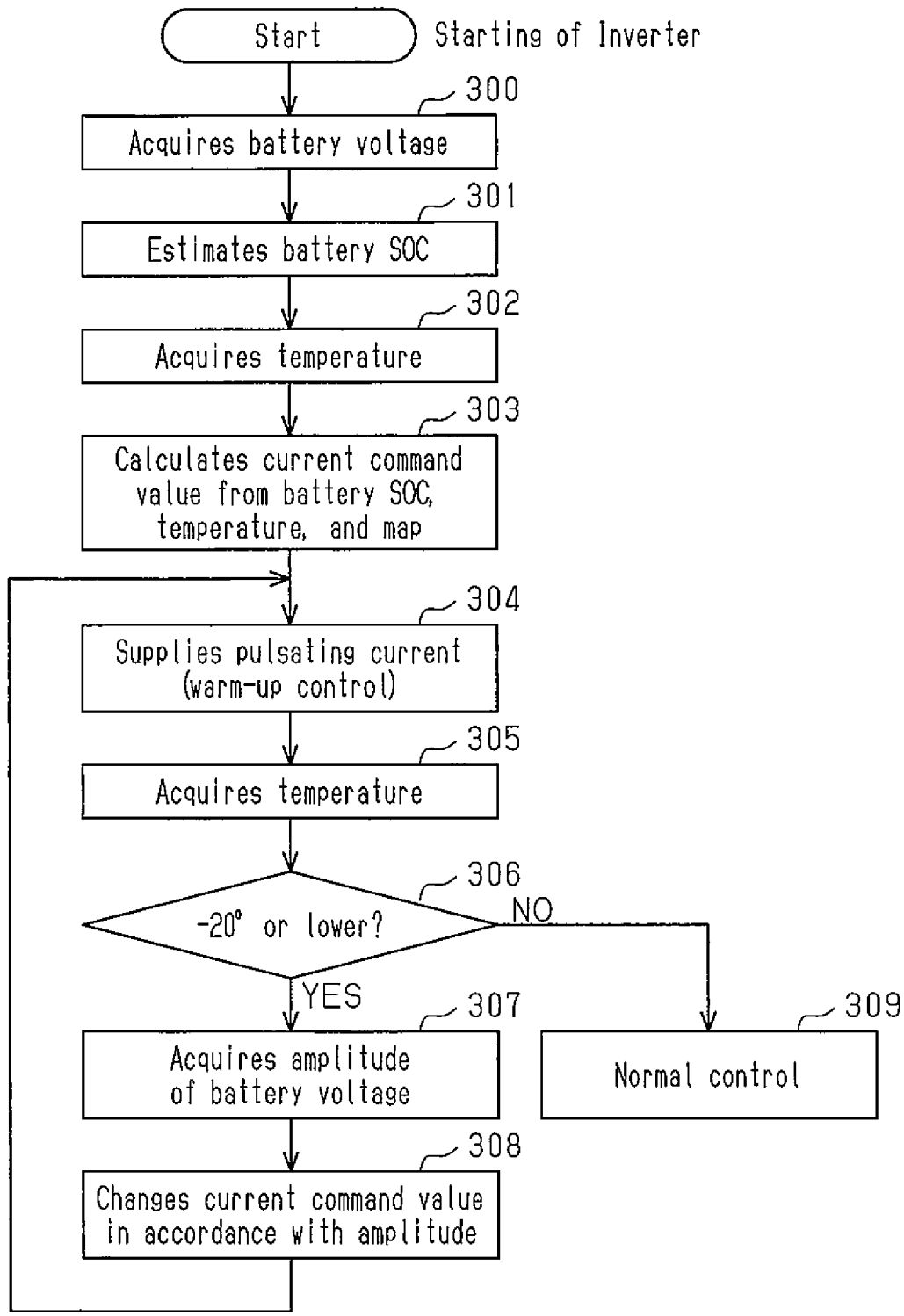
FIG. 7 is a flowchart for describing the operation according to a third embodiment.

As shown in FIG. 7, in step 300, the microcomputer 41 of FIG. 1 obtains the battery voltage (system voltage) Vb at starting of the inverter device 10 and, in step 301, estimates the battery SOC from the battery voltage Vb. In step 302, the microcomputer 41 further obtains the temperature of the inverter device 10 (including the electrolytic capacitor 80) detected by the temperature sensor 90. In step 303, the microcomputer 41 obtains the current command value (the current command value of the initial value) from the battery SOC, the temperature, and the current command map. That is, the microcomputer 41 calculates the current command value determined based on the battery SOC, which serves as the charge information of the battery 50, and the temperature using the map stored in the memory 42, which serves as the storage.

Subsequently, in step 304, the microcomputer 41 performs the warm-up control by supplying a pulsating current. The process of step 304 will be described with reference to FIG. 8. The microcomputer 41 controls the switching elements S1 to S6 of the inverter circuit 20 to supply the pulsating current having an amplitude ΔI, the central value of which is the current command value calculated in step 303 of FIG. 7, to the coils 61 to 63 of the electric motor 60. The amplitude ΔI is a predetermined fixed value.

In step 305 of FIG. 7, the microcomputer 41 obtains the temperature of the inverter device 10 (including the electrolytic capacitor 80) detected by the temperature sensor 90 and, in step 306, determines whether the temperature is lower than or equal to −20° C. If the temperature is lower than or equal to −20° C., the microcomputer 41 proceeds to step 307 and obtains, or detects, the amplitude of the battery voltage Vb (see the amplitude ΔW1 in FIGS. 8 and 9) when the pulsating current is supplied for, for example, a few seconds (three or four cycles). In step 308, the microcomputer 41 changes the current command value, that is, the current command value of the warm-up current supplied to the coils 61 to 63 of the electric motor 60 in accordance with the obtained, or detected, amplitude of the battery voltage Vb and returns to step 304. The processes of steps 307 and 308 will be described with reference to FIGS. 8 and 9.

Figure 8:
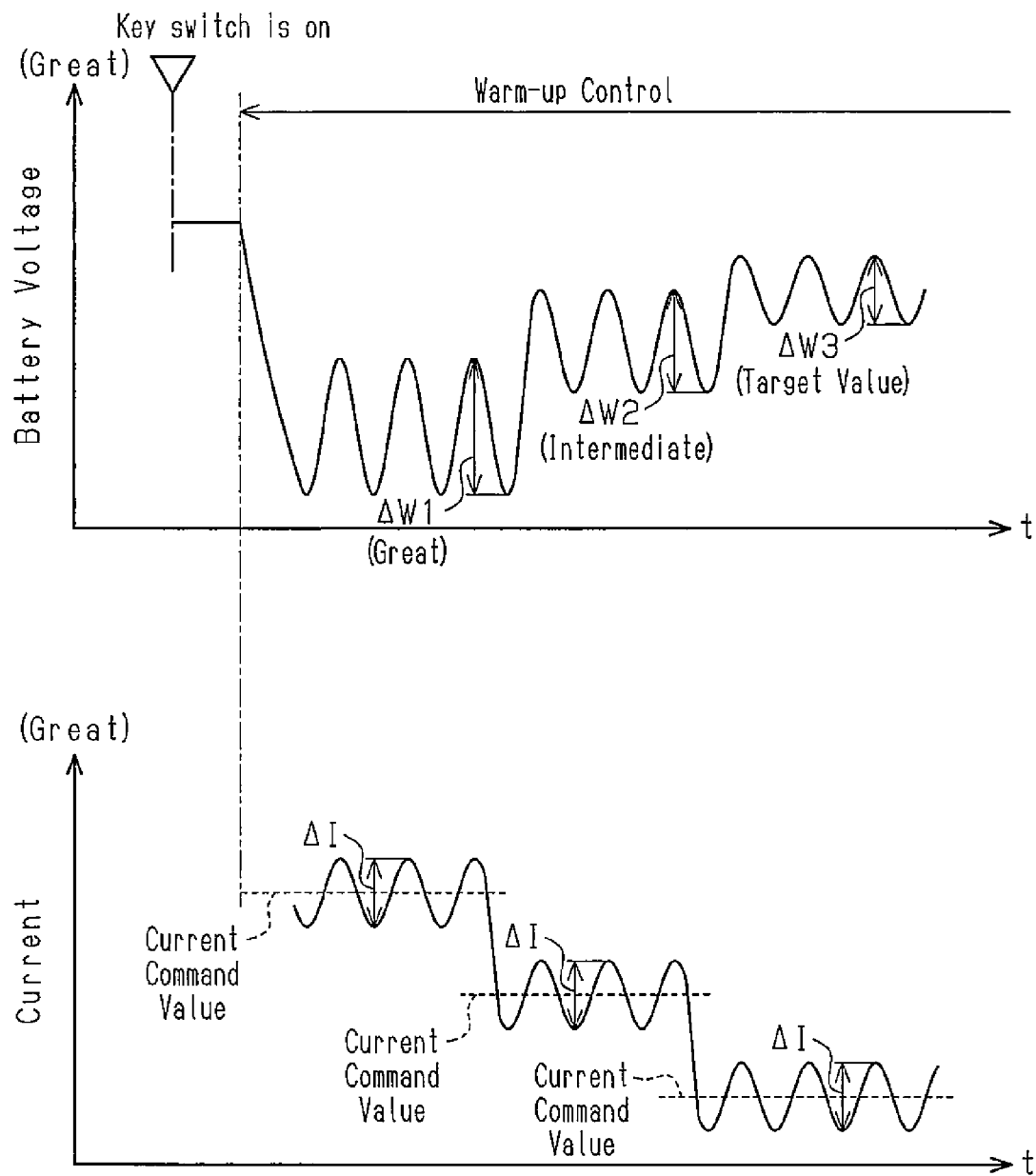
FIG. 8 is a time chart for describing the operation according to the third embodiment.
Figure 9:
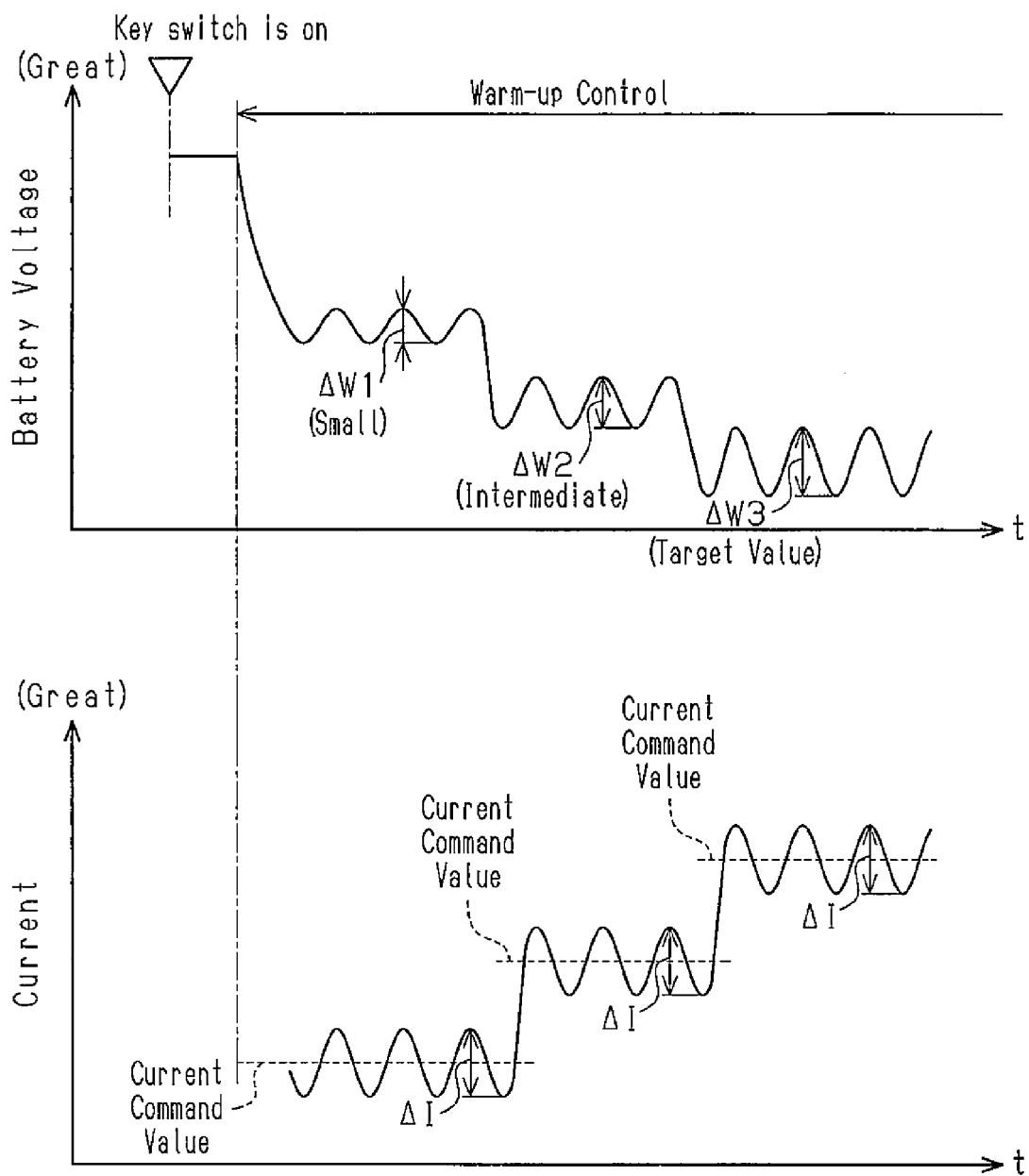
FIG. 9 is a time chart for describing the operation according to the third embodiment.

The case in which the time period from when the previous warm-up control is performed to when the present warm-up control is performed is long and deterioration of the battery has progressed to increase the internal resistance is as shown in, for example, FIG. 8. The microcomputer 41 performs the following control if the amplitude ΔW1 of the battery voltage is greater than the target value in step 308 of FIG. 7.

The microcomputer 41 changes the current command value to a value smaller than the present value, supplies the pulsating current having the amplitude ΔI, the central value of which is the updated current command value, and obtains the amplitude ΔW2 of the battery voltage when such a pulsating current is supplied. The amplitude ΔW2 is smaller than the amplitude ΔW1. If the amplitude ΔW2 of the battery voltage is still greater than the target value, the microcomputer 41 changes the current command value to a value smaller than the present value. The microcomputer 41 supplies the pulsating current having the amplitude ΔI, the central value of which is the updated current command value, and obtains the amplitude ΔW3 of the battery voltage when such a pulsating current is supplied. If the amplitude ΔW3 is smaller than the amplitude ΔW2 and is equal to a target value, the pulsating current having the amplitude ΔI, the central value of which is the current command value, is continuously supplied.

When the battery 50 is replaced with a new one, the internal resistance of the battery 50 is small. Such a case is represented by, for example, FIG. 9. The microcomputer 41 performs the following control if the amplitude ΔW1 of the battery voltage is less than the target value in step 308 of FIG. 7.

The microcomputer 41 changes the current command value to a value greater than the present value, supplies the pulsating current having the amplitude ΔI, the central value of which is the updated current command value, and obtains the amplitude ΔW2 of the battery voltage when such a pulsating current is supplied. The amplitude ΔW2 is greater than the amplitude ΔW1. If the amplitude ΔW2 of the battery voltage is still less than the target value, the microcomputer 41 changes the current command value to a value greater than the present value. The microcomputer 41 supplies the pulsating current having the amplitude ΔI, the central value of which is the updated current command value, and obtains the amplitude $\Delta W3$ of the battery voltage when such a pulsating current is supplied. If the amplitude $\Delta W3$ is greater than the amplitude $\Delta W2$ and is equal to the target value, the pulsating current having the amplitude $\Delta I$, the central value of which is the current command value, is continuously supplied.

In this manner, the microcomputer 41 changes the current to be supplied to the coils 61 to 63 of the electric motor 60 based on the amplitude of the voltage of the battery 50 when the switching elements S1 to S6 of the inverter circuit 20 are controlled in order to supply the pulsating current to the coils 61 to 63 of the electric motor 60.

In step 306 of FIG. 7, if the temperature detected by the temperature sensor 90 is greater than −20°, the microcomputer 41 proceeds to step 309 and shifts from the warm-up control to the normal operation control.

In addition to the advantages (1) to (3), the present embodiment provides the following advantage.

(6) In the warm-up control, the microcomputer 41, which serves as the warm-up controller, controls the switching elements S1 to S6 of the inverter circuit 20 to supply the warm-up current as a pulsating current pulsating at the predetermined amplitude to the coils 61 to 63 of the electric motor 60 and detects the amplitude of the voltage of the battery 50 during pulsating current supply. The microcomputer 41 changes the current command value of the warm-up current to be supplied to the coils 61 to 63 of the electric motor 60 based on the detected amplitude of the voltage of the battery 50. Thus, even in the case in which the time period from when the previous warm-up control is performed to when the present warm-up control is performed is long and in the case in which the battery 50 has been replaced, the current supplied to the coils 61 to 63 of the electric motor 60 is optimized. That is, the optimal warm-up control current command value is determined and the warm-up control is quickly completed. Furthermore, the present embodiment does not require preparing multiple current command maps and promptly completes the warm-up control with the optimal maximum current value, offering versatility.

The time taken to obtain the voltage amplitude by supplying the pulsating current may be one cycle at the minimum.

Fourth Embodiment

A fourth embodiment will now be described. The differences from the third embodiment will be mainly discussed.

Like the third embodiment, the present embodiment is suitable for the case in which the time period from when the previous warm-up control is performed to when the present warm-up control is performed is long and the case in which the battery 50 is replaced.

Figure 10:
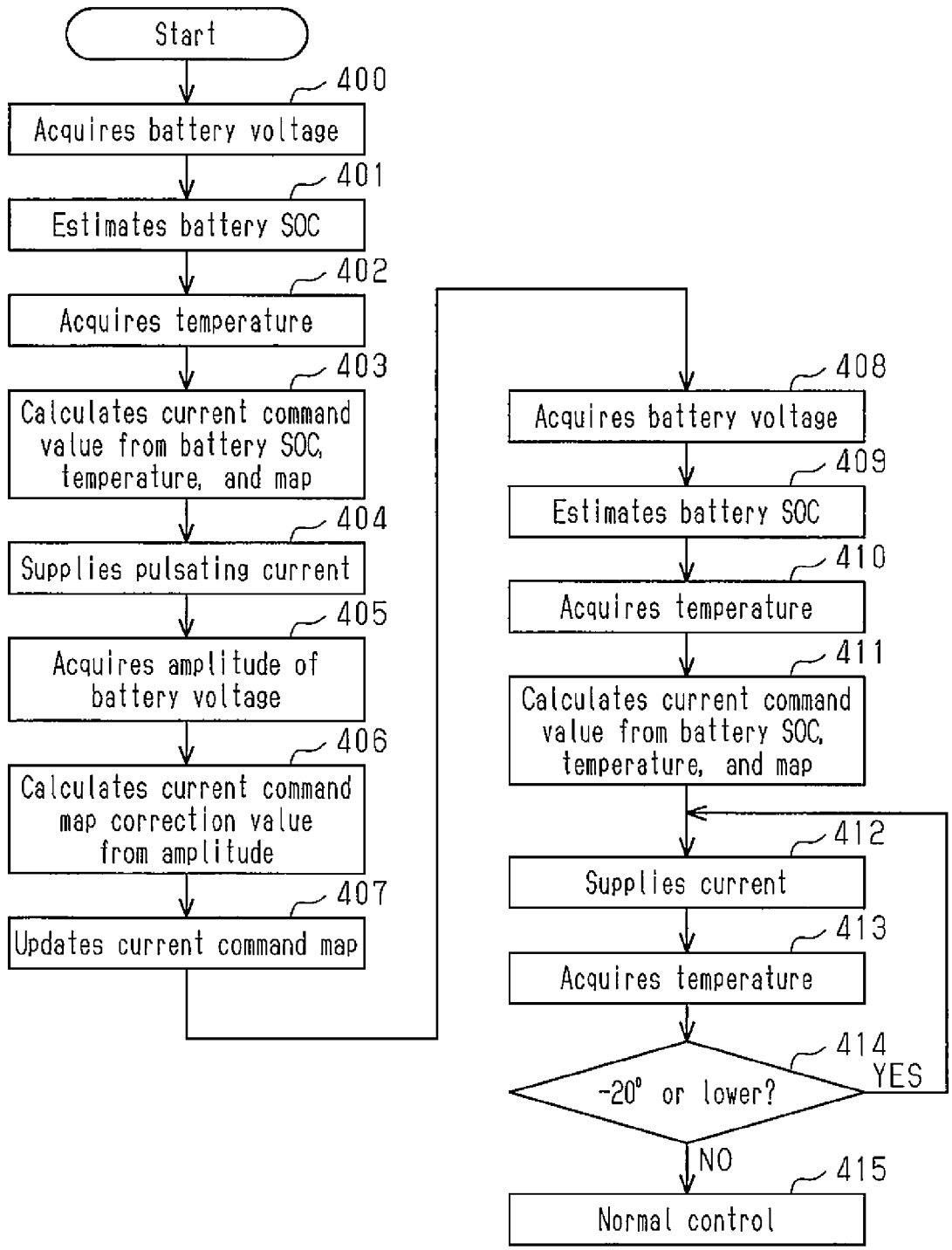
FIG. 10 is a flowchart for describing the operation according to a fourth embodiment.

Instead of FIG. 7, the process shown in FIG. 10 is performed.

As shown in FIG. 10, in step 400, the microcomputer 41 obtains the battery voltage (system voltage) Vb when starting the inverter device 10 and, in step 401, estimates the battery SOC from the battery voltage Vb. In step 402, the microcomputer 41 further obtains the temperature of the inverter device 10 (including the electrolytic capacitor 80) detected by the temperature sensor 90. In step 403, the microcomputer 41 calculates the current command value (the current command value of the initial value) from the battery SOC, the temperature, and the current command map. That is, the microcomputer 41 calculates the current command value determined based on the battery SOC, which serves as the charge information of the battery 50, and the temperature, using the map stored in the memory 42, which serves as the storage.

Subsequently, in step 404, the microcomputer 41 supplies the pulsating current before the warm-up control. The process of step 404 will be described with reference to FIG. 11. The microcomputer 41 controls the switching elements S1 to S6 of the inverter circuit 20 to supply the pulsating current having the amplitude $\Delta I$, the central value of which is the current command value calculated in step 403 of FIG. 10, to the coils 61 to 63 of the electric motor 60. The amplitude $\Delta I$ is a predetermined fixed value.

In step 405 of FIG. 10, the microcomputer 41 obtains, or detects, the amplitude of the battery voltage Vb (see the amplitude $\Delta W1$ in FIGS. 11 and 12) when the pulsating current is supplied for, for example, a few seconds (three or four cycles). In step 406, the microcomputer 41 calculates a current command map correction value based on the obtained, or detected, amplitude of the battery voltage Vb and, in step 407, performs the warm-up control preprocessing in which the current command map is updated. That is, the microcomputer 41 updates the map based on the amplitude of the voltage of the battery 50 at the time of controlling the switching elements S1 to S6 of the inverter circuit 20 to supply the pulsating current to the coils 61 to 63 of the electric motor 60.

The processes of steps 406 and 407 will be described with reference to FIGS. 11 and 12.

Figure 11:
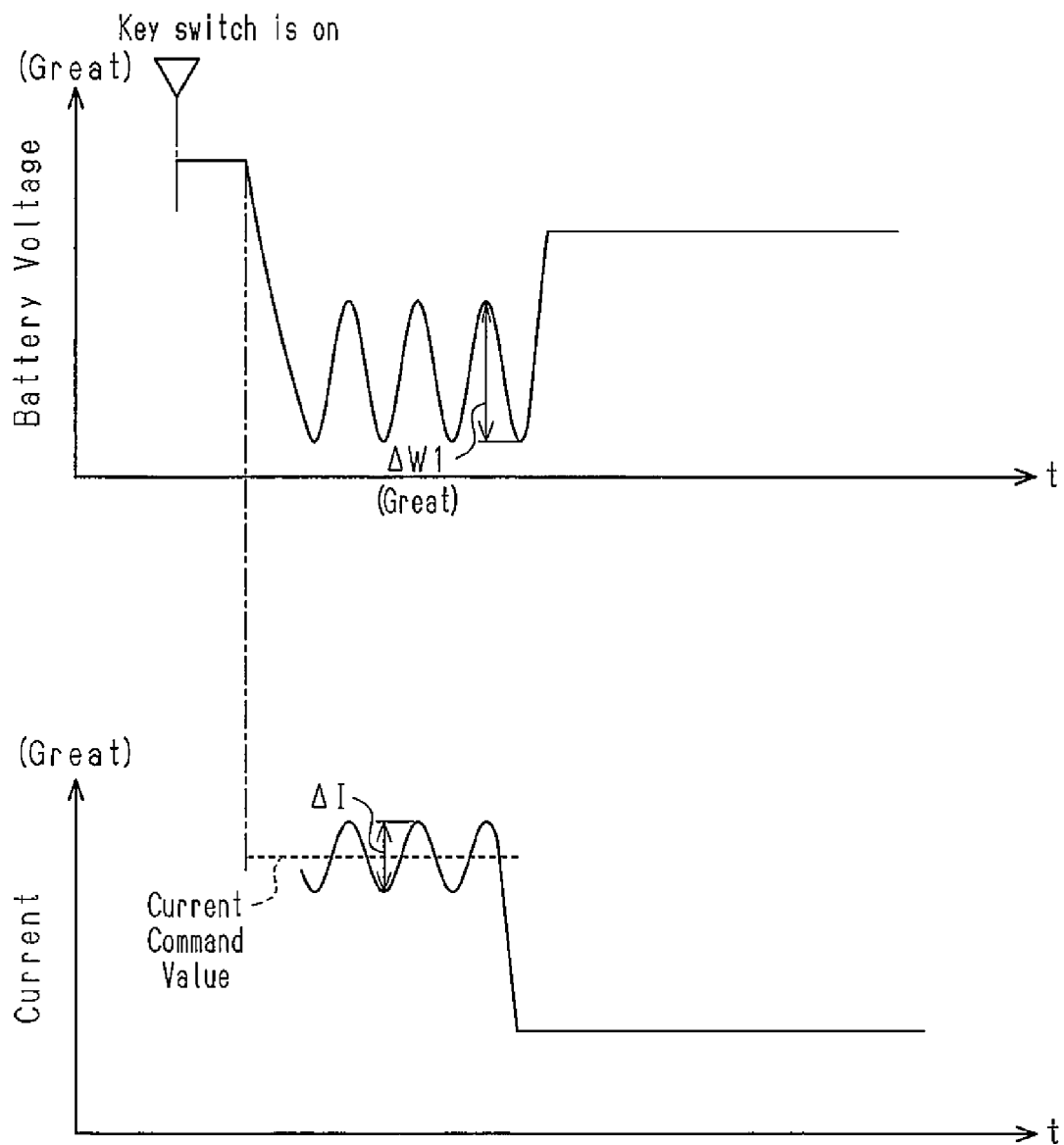
FIG. 11 is a time chart for describing the operation according to the fourth embodiment.
Figure 12:
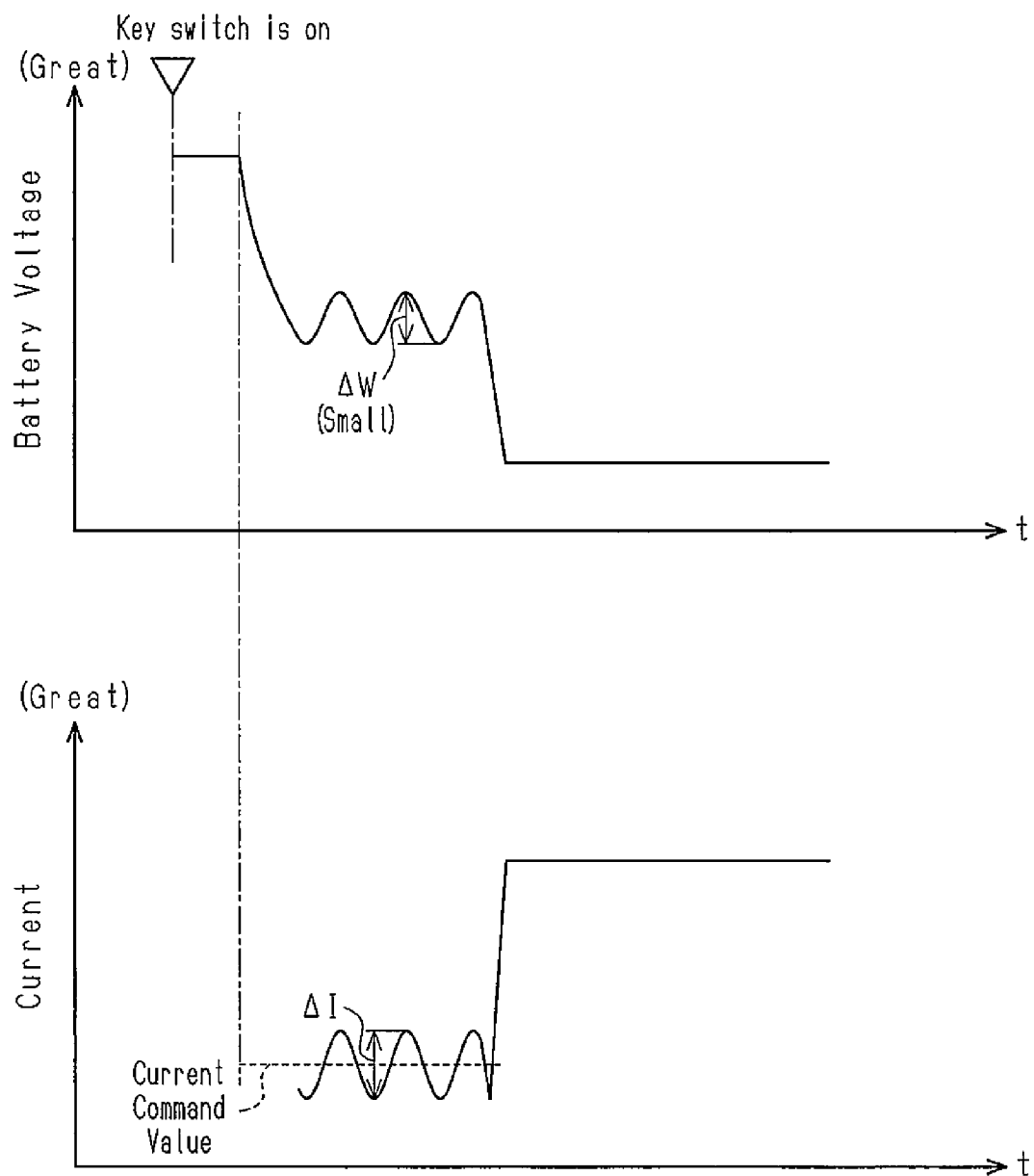
FIG. 12 is a time chart for describing the operation according to the fourth embodiment.

If the time period from when the previous warm-up control is performed to when the present warm-up control is performed is long and deterioration of the battery has progressed to increase the internal resistance, the battery voltage and the electric current change, for example, as shown in FIG. 11. If the amplitude $\Delta W$ of the battery voltage is greater than the target value, the internal resistance of the battery is great. Thus, in steps 406 and 407 of FIG. 10, the microcomputer 41 updates the map to change the current command value to a value less than the present value. More specifically, if the voltage amplitude $\Delta W$ is great when the pulsating current is supplied as shown in FIG. 11, the microcomputer 41, for example, shifts the map shown by the long dashed double-short dashed line downward to the map shown by the solid line in FIG. 6 to reduce the current command value.

When the battery 50 is replaced with a new one, the internal resistance of the battery 50 is small. Such a case is represented by, for example, FIG. 12. If the amplitude $\Delta W$ of the battery voltage is less than the target value, the internal resistance of the battery 50 is small. Thus, in steps 406 and 407 of FIG. 10, the microcomputer 41 changes the map to change the current command value to a value greater than the present value. More specifically, if the voltage amplitude is small when the pulsating current is supplied as shown in FIG. 12, the microcomputer 41, for example, shifts the map shown by the solid line upward to the map shown by the long dashed double-short dashed line in FIG. 6 to increase the current command value.

After the process of step 407 in FIG. 10, the microcomputer 41 obtains the battery voltage (system voltage) in step 408 and estimates the battery SOC from the battery voltage in step 409. In step 410, the microcomputer 41 further obtains the temperature of the inverter device 10 (including the electrolytic capacitor 80) detected by the temperature sensor 90. The microcomputer 41 then calculates, in step 411, the current command value from the battery SOC, the temperature, and the map. Subsequently, the microcomputer 41 proceeds to step 412 and supplies electric currents at the current command value calculated in step 411. That is, the switching elements S1 to S6 of the inverter circuit 20 are controlled to supply direct currents at the current command value of the updated map to the coils 61 to 63 of the electric motor 60.

In step 413, the microcomputer 41 obtains the temperature of the inverter device 10 (including the electrolytic capacitor 80) detected by the temperature sensor 90 and, in step 414, determines whether the temperature is lower than or equal to −20° C. If the temperature is lower than or equal to −20° C., the microcomputer 41 returns to step 412. If the temperature of the inverter device 10 (including the electrolytic capacitor 80) detected by the temperature sensor 90 is greater than −20° C., the microcomputer 41 shifts from the warm-up control to the normal operation control in step 415.

In addition to the advantages (1) to (4), the present embodiment provides the following advantage.

(7) Prior to the warm-up control, the microcomputer 41, which serves as the warm-up controller, controls the switching elements S1 to S6 of the inverter circuit 20 to supply the pulsating current pulsating at the predetermined amplitude to the coils 61 to 63 of the electric motor 60, detects the voltage amplitude of the battery while supplying the pulsating current, and performs the warm-up control preprocessing in which the map is updated based on the detected voltage amplitude of the battery 50. Thus, even in the case in which the time period from when the previous warm-up control is performed to when the present warm-up control is performed is long and the case in which the battery 50 has been replaced, a preferable electric current is supplied to the coils 61 to 63 of the electric motor 60 by updating the map. That is, the optimal warm-up control current command value is determined and the warm-up control is quickly completed. Furthermore, the present embodiment does not require preparing multiple current command maps and promptly completes the warm-up control with the optimal maximum current value, offering versatility.

The time taken to obtain the voltage amplitude by supplying the pulsating current may be one cycle at the minimum.

The present invention is not limited to the above described embodiments, but may be embodied as follows, for example.

Instead of estimating the battery SOC based on the voltage, the microcomputer 41 may acquire the battery SOC through, for example, communication if any other device (ECU) obtains it. That is, if the system includes a battery ECU and the battery ECU grasps the battery state of charge (SOC), the microcomputer 41 may acquire the temperature and the battery SOC through controller area network (CAN) communication and may determine the current command value using the current command map. Alternatively, if the vehicle-controlling ECU 120 of FIG. 1 has the battery SOC, the microcomputer 41 may acquire the battery SOC through, for example, the CAN communication and determine the current command value using the current command map.

The invention claimed is:

1. An inverter device comprising:
   an inverter circuit having a plurality of switching elements in a bridge connection;
   a capacitor, which is connected in parallel to an input side of the inverter circuit;
   a temperature detector, which detects a temperature of the capacitor;
   a battery charge information acquisition section that acquires charge information of a battery configured to be connected to the input side of the inverter circuit; and
   a warm-up controller, wherein, when the temperature of the capacitor detected by the temperature detector is lower than a prescribed temperature, the warm-up controller determines a warm-up current based on the charge information of the battery acquired by the battery charge information acquisition section and the temperature of the capacitor detected by the temperature detector and controls the switching elements of the inverter circuit to supply the warm-up current to a coil of an electric motor configured to be connected to an output side of the inverter circuit.

2. The inverter device according to claim 1, further comprising a storage, which stores a map showing a relationship among the temperature of the capacitor, the charge information of the battery, and a current command value of the warm-up current,
   wherein the warm-up controller uses the map stored in the storage to determine the current command value of the warm-up current based on the charge information of the battery acquired by the battery charge information acquisition section and the temperature of the capacitor detected by the temperature detector.

3. The inverter device according to claim 2, further comprising a learning section, which updates the map showing the relationship among the temperature of the capacitor, the charge information of the battery, and the current command value of the warm-up current based on a voltage of the battery during the warm-up control and stores the updated map in the storage.

4. The inverter device according to claim 1, wherein, in the warm-up control, the warm-up controller controls the switching elements of the inverter circuit to supply the warm-up current to the coil of the electric motor as a direct current.

5. The inverter device according to claim 1, wherein, in the warm-up control, the warm-up controller controls the switching elements of the inverter circuit to supply the warm-up current to the coil of the electric motor as a pulsating current pulsating at a predetermined amplitude, detects the voltage amplitude of the battery when supplying the pulsating current, and changes the current command value of the warm-up current supplied to the coil of the electric motor based on the detected voltage amplitude of the battery.

6. The inverter device according to claim 2, wherein, before the warm-up control, the warm-up controller controls the switching elements of the inverter circuit to supply a pulsating current pulsating at a predetermined amplitude to the coil of the electric motor, detects the voltage amplitude of the battery when supplying the pulsating current, and performs a warm-up control preprocessing for updating the map based on the detected voltage amplitude of the battery.

7. The inverter device according to claim 1, wherein the charge information of the battery is a state of charge of the battery.

8. The inverter device according to claim 7, wherein:
   the lower the temperature of the capacitor, the smaller the current command value is set to by the warm-up controller; and
   the lower the state of charge of the battery is, the smaller the current command value is set to by the warm-up controller.

* * * * *